(12) United States Patent
Funato et al.

(10) Patent No.: US 9,329,207 B2
(45) Date of Patent: May 3, 2016

(54) SURFACE CURRENT PROBE

(75) Inventors: Hiroki Funato, Tokyo (JP); Takashi Suga, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 102 days.

(21) Appl. No.: 14/125,754

(22) PCT Filed: Jun. 22, 2012

(86) PCT No.: PCT/JP2012/065942
§ 371 (c)(1),
(2), (4) Date: Dec. 12, 2013

(87) PCT Pub. No.: WO2013/018458
PCT Pub. Date: Feb. 7, 2013

(65) Prior Publication Data
US 2014/0132255 A1 May 15, 2014

(30) Foreign Application Priority Data

Jul. 29, 2011 (JP) ................................. 2011-166184

(51) Int. Cl.
*G01R 15/14* (2006.01)
*G01R 15/18* (2006.01)

(52) U.S. Cl.
CPC ............ *G01R 15/148* (2013.01); *G01R 15/185* (2013.01)

(58) Field of Classification Search
CPC .. G01R 33/02; G01R 15/146; G01R 31/3613; G01N 27/91033
USPC ................. 324/724, 600, 452–453, 500, 514, 324/754.04, 200, 244
See application file for complete search history.

(56) References Cited

U.S. PATENT DOCUMENTS

| 5,717,326 A | 2/1998 | Moriwaki |
| 2004/0095126 A1* | 5/2004 | Kudo et al. ................ 324/117 R |
| 2010/0188081 A1* | 7/2010 | Lammegger .................. 324/304 |

FOREIGN PATENT DOCUMENTS

| JP | 8-273952 A | 10/1996 |
| JP | 2002-156430 A | 5/2002 |
| JP | 2003-279611 A | 10/2003 |
| JP | 2009-210406 A | 9/2009 |

OTHER PUBLICATIONS

Corresponding International Search Report with English Translation dated Jul. 17, 2012 (six (6) pages).

* cited by examiner

*Primary Examiner* — Melissa Koval
*Assistant Examiner* — Trung Nguyen
(74) *Attorney, Agent, or Firm* — Crowell & Moring LLP

(57) ABSTRACT

A surface current probe includes two current detection coils disposed so as to detect a magnetic field in a direction vertical to an current detection target plane; two disturbance-control coils, each thereof being disposed at a position farther away from each of the two current detection coils, against the current detection target plane, so as to be disposed for detection of a magnetic field in a direction parallel to the current detection target plane; and a terminal resistor coupled to each of the two disturbance-control coils. The two disturbance-control coils are disposed such that induced voltages generated against the current detection target plane at the time of detection of a magnetic field on the outer side of the two current detection coils are opposed in polarity to each other.

8 Claims, 4 Drawing Sheets

SURFACE CURRENT PROBE

BACKGROUND

The present invention relates to a technology for controlling disturbance in a probe for measuring current.

With an electronic device, and so forth, it is effective to cause the enclosure of the electronic device to be electromagnetically shielded to thereby control a level of unwanted electromagnetic-radiation generated by a circuit board in order to confine the unwanted electromagnetic-radiation generated by the circuit board inside the electronic device, and prevent leakage thereof to outside the electronic device.

The inventor, et al. have thus far disclosed a magnetic field probe, or a measuring technique and a measuring instrument, serving as a support technology for reducing the unwanted electromagnetic-radiation generated by the circuit board, as described in Japanese Unexamined Patent Application Publication No. 2002-156430, and Japanese Unexamined Patent Application Publication No. 2003-279611, respectively.

One of these patent documents, namely, Japanese Unexamined Patent Application Publication No. 2002-156430 relates to a magnetic field probe (What is claimed is:) provided with a shield disposed around a magnetic field detection coil with magnetic fluxes interlinked with coil in assecured state, and Japanese Unexamined Patent Application Publication No. 2003-279611 relates to an electromagnetic-wave emission-source search device having a magnetic field probe for measuring magnetic field distribution in the vicinity of a three-dimensional enclosure, a means for moving or rotating the probe in the directions of x, y, z, θ, and φ, respectively, a means for finding current distribution from the magnetic field distribution, and a means for finding electric field strength at desired distances from the current distribution.

With these devices, a position of a current which is a source of electromagnetic radiation is identified by measuring the magnetic field distribution in the vicinity above the circuit board to be thereby used in review for the purpose of reducing electromagnetic radiation from the circuit board.

SUMMARY

A magnetic field probe and a surface current probe each detect a magnetic field generated by a target current to be converted into voltage, thereby identifying intensity as well as phase of the target current from intensity as well as phase of the voltage. In the case where currents flowing through the pattern of a circuit board, and so forth are targets for measurements, a value of the target currents is large, so that an influence of a magnetic field generated by a current flowing through a peripheral pattern can be ignored. However, in the case where very small surface currents distributed the enclosure of an electronic device, and in sheet fashion are each a target for measurement, magnetic fields generated by an adjacent surface current, a current flowing through a peripheral interconnection, and a substrate pattern, respectively, are relatively large as compared with the magnetic field generated by the surface current as the target, whereupon the probe ends up detecting these disturbance magnetic fields, thereby creating a problem of deterioration in detection accuracy of the magnetic field generated by the current as the target for measurement.

Further, a technology according to the related art includes a technique whereby two units of sensors for detecting a magnetic field as a detection target, respectively, are disposed around a target current such that magnetic-field detection-directions thereof are opposed to each other, thereby removing a disturbance voltage component occurring to the sensor by the agency of a planar magnetic field approaching from afar, however, if a disturbance magnetic field is not of a plane wave, that is, a current for generating the disturbance magnetic field is not sufficiently afar, the disturbance voltage component cannot be removed. With a common electronic device, a current for causing disturbance is not afar, but is present in the neighborhood or quasi-neighborhood, so that deterioration of measurement accuracy has been unavoidable.

Accordingly, it is an object of the present invention to provide a current measuring probe capable of controlling deterioration in measurement accuracy, caused by a disturbance magnetic field.

A brief overview of a representative embodiment of the invention disclosed under the present application is described as follows.

According to one aspect of the invention, there is provided a surface current probe having two current detection coils disposed so as to detect a magnetic field in a direction vertical to an current detection target plane, two disturbance-control coils, each thereof being disposed at a position farther away from each of the two current detection coils, against the current detection target plane, so as to be disposed for detection of a magnetic field in a direction parallel to the current detection target plane; and a terminal resistor coupled to each of the two disturbance-control coils. The two disturbance-control coils are disposed such that induced voltages generated against the current detection target plane at the time of detection of a magnetic field on the outer side of the two current detection coils are opposed in polarity to each other.

With the present invention, a surface current of an enclosure and so forth can be accurately measured while controlling the influences of a current and a magnetic field in the surroundings.

DETAILED DESCRIPTION

Embodiments of the invention are described hereinafter with reference to the accompanied drawings.

Figure 1:
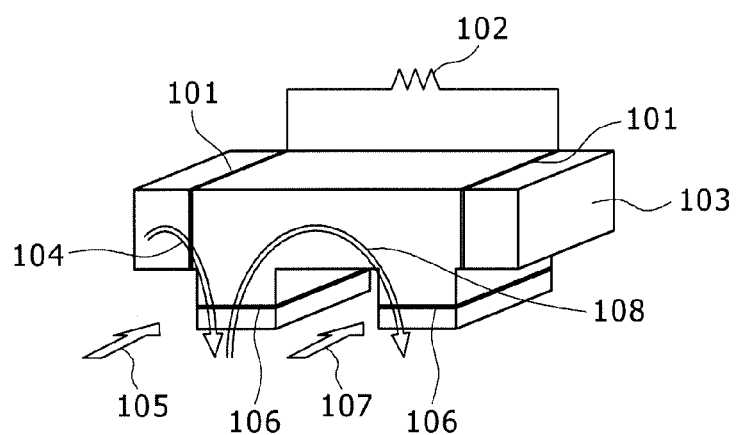
FIG. 1 is a view showing a structure of a surface current probe controlling disturbance according to the invention.

FIG. 1 is a view showing a structure of a surface current probe according to the invention. An influence exerted by a magnetic field generated by a peripheral current is controlled by the surface current probe depicted in FIG. 1. The surface current probe is provided with a surface current detection coiled conductor 106 for detecting a magnetic field 108 generated by a surface current 107 as a measurement target, a disturbance-control coiled conductor 101 for reducing an influence of a disturbance magnetic field 104 generated from a disturbance current 105 on the periphery of the surface current 107 as the measurement target, a core member 103, and a terminal resistor 102.

Herein, the surface current is first explained about. An electronic device has its members housed in the enclosure thereof, such as a circuit board, harness, and so forth. Noises occurring due to activation of an LSI, and so forth, on the circuit board, are propagated to respective circuit boards of other electronic devices via the harness, and so forth. In general, GND (a reference potential) of the circuit board, and so forth, is electrically coupled to the enclosure, so that the enclosure is often at the same potential as that of GND. In such a case, the noises generated by the circuit board and so forth are leaked to the enclosure, and a noise current flows through the surface of the enclosure. The noise current flowing through the surface of the enclosure becomes a source of an electromagnetic radiation noise, whereupon an electromagnetic noise is radiated to the periphery of the electronic device. The surface current probe represents an important technology for quantitative evaluation of such a phenomenon as described. A part acting as a cause of electromagnetic radiation to surroundings can be identified through the measurement of the surface current of the enclosure by use of the surface current probe, thereby enabling a countermeasure plan to be studied. However, in the case of measuring the surface current of the enclosure, a multitude of currents generating respective magnetic fields are present on the peripheries thereof, such as the circuit board, the harness, and so forth. Because the respective magnetic fields, generated by these currents on the peripheries thereof, are mixed in as disturbance at the time of measuring the surface current of the enclosure, there occurs deterioration in measurement accuracy of the current as the measurement target Next, the principle underlying the measurement of the surface current is described hereinafter. In general, a method for detecting a magnetic field generated by current, and a method for measuring a voltage drop in a current pathway are in widespread use as a method for measuring current. With the method for measuring a voltage drop in the current pathway, a resistance value of the current pathway is required, and in the case of the enclosure of an electronic device where the surface current is intricately distributed, and so forth, it is extremely difficult to accurately obtain the resistance value of the current pathway, and therefore, this method is not practicable. Accordingly, the method for detecting the magnetic field generated by current is adopted by the present invention. As the method for detecting the magnetic field, use is made of a coiled conductor hereinafter. Upon the coiled conductor being brought close to a measurement target current, a magnetic field generated by the target current is interlinked with the coiled conductor, whereupon a voltage proportional to interlinkage magnetic field strength is induced at both ends of the coiled conductor. Measurement of this induced voltage will enable the interlinkage magnetic field, that is, target surface current strength to be measured. With the method for detecting the magnetic field, use is not limited to the coiled conductor, and use may be made of a Hall element, and so forth. If a magnetic field generated by a peripheral current, other than the magnetic field generated by the current as the measurement target, is interlinked with the coiled conductor, as previously described, this will create disturbance to thereby cause deterioration in the measurement accuracy.

Next, a structure of the surface current probe according to the invention is described hereinafter.

The surface current probe is provided with the surface current detection coiled conductor 106 for detecting the magnetic field 108 generated by the surface current 107 as the measurement target. Two units of the surface current detection coiled conductors 106 are disposed so as to detect a magnetic field in a direction vertical to a plane (a measurement target plane 204 in FIG. 2) where the surface current 107 as the measurement target flows through. Further, the two units of the surface current detection coiled conductors 106 are disposed in such a way as to keep a distance matching a desired spatial resolution therebetween. In this case, the two units of the surface current detection coiled conductors 106 are electrically coupled to each other; however, electrical coupling is effected such that induced voltages generated at the time of detecting the magnetic fields in the same direction are opposed in polarity to each other. For example, if one of the coils is a clockwise coil, a counterclockwise coil is adopted for the other of the coils. This will enable the respective induced voltages to be opposed in polarity to each other. Thereby, the respective induced voltages as generated become identical in polarity at the time of detection of the magnetic fields generated in a concentric fashion by the surface current present in an interval between the two surface current detection coils disposed with the distance kept therebetween, so that a detected voltage will increase in value.

Further, the surface current probe is provided with two units of the disturbance-control coiled conductors 101 for controlling disturbance of the surface current 107 as the measurement target. In the case where the surface current 107 as the measurement target is at the center, the two units of the disturbance-control coiled conductors 101 are each disposed on the outer side of each of the two units of the surface current detection coiled conductors 106. The disturbance-control coiled conductors 101 are disposed in such a direction as to enable a magnetic field component in parallel with the measurement target plane 204 to be detected.

The disturbance-control coils, and the surface current detection coils are all coupled in series to be subsequently coupled to the terminal resistor 102. As to polarity, the disturbance-control coil is coupled to the surface current detection coil in such polarity as to cause the induced voltages cancel each other out when the disturbance magnetic field 104 generated by the disturbance current 105 flowing on the outer side of the surface current detection coil is interlinked with both the disturbance-control coil, and the surface current detection coil. Thereby, the disturbance magnetic field 104 generated by a current other than the surface current 107 as the measurement target, namely, the current present in the interval between the two surface current detection coils, in other words, the disturbance magnetic field 104 generated by a surface current present on the outer side of each of the two surface current detection coils will interlink with both the disturbance-control coiled conductors 101, and the surface current detection coiled conductors 106, whereupon the induced voltages are generated in such polarity so as to cancel each other out, so that it is possible to detect only the induced voltage generated by the magnetic field generated by a measurement target current.

An induced voltage generated by a coiled conductor against interlinkage magnetic fluxes is proportional to the product of an opening space of a coil, and the number of turns in the coil. Accordingly, the product of the opening space of the disturbance-control coil, and the number of turns therein is rendered equal to that of the surface current detection coil. If the disturbance-control coil differs from the surface current detection coil in respect of the product of the opening space, and the number of turns, the respective induced voltages differ from each other even though interlinked with the same magnetic field, so that there occurs deterioration in cancelling-out effects against the disturbance magnetic fields.

Further, the disturbance-control coiled conductor 101 must be disposed close to the surface current detection coiled conductor 106. If respective positions thereof are apart from each other, distances from the disturbance current to the respective coils will differ from each other, so that respective interlinkage magnetic field strengths will differ fro each other, thereby deteriorating disturbance-control effects. Accordingly, a distance between the disturbance-control coiled conductor 101 and the surface current detection coiled conductor 106 is preferably not more than a distance from the disturbance-control coiled conductor 101 up to the measurement target plane 204.

Figure 2:
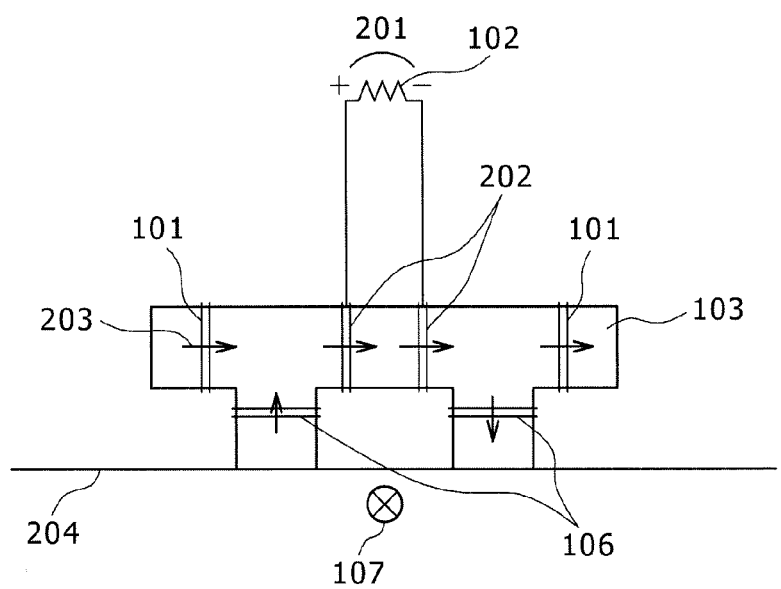
FIG. 2 is a view showing a structure of a highly sensitive surface current probe according to the invention.

FIG. 2 is a view showing a structure of a highly sensitive surface current probe according to the invention. The highly sensitive surface current probe differs from the surface current probe depicted in FIG. 1 in that two units of surface current detection coiled conductors 202 are additionally disposed between the two units of the disturbance-control coiled conductors 101, the two units of the surface current detection coiled conductors 202 being disposed in a direction so as to enable a magnetic field component in parallel with the measurement target plane 204 to be detected. Because the two units of the surface current detection coiled conductors 202 are additionally provided in the direction for enabling the detection of the magnetic field component in parallel with the measurement target plane 204, aside from the surface current detection coiled conductors 106 shown in FIG. 1, it is possible to increase the induced voltage due to the magnetic field generated by the surface current 107 as the measurement target.

Figure 3:
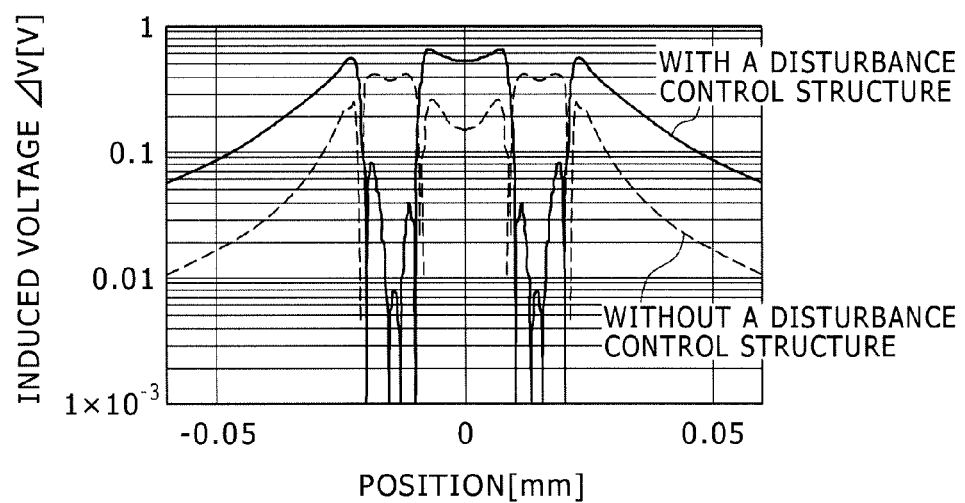
FIG. 3 is a view showing effects of the surface current probe according to the invention.
Figure 4:
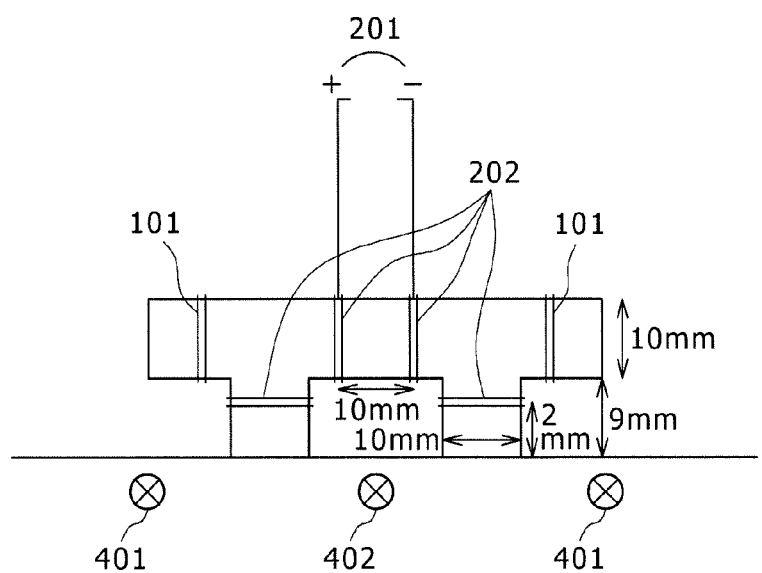
FIG. 4 is a view showing respective positions of a surface current detection coil, and a disturbance-control coil, for use in verification of the effects in FIG. 3.

FIG. 3 is a view showing effects of the surface current probe according to the invention, and FIG. 4 is a view showing respective positions of the surface current detection coil, and the disturbance-control coil, for use in verification of the effects in FIG. 3.

FIG. 3 shows a difference in the induced voltage between the case where a disturbance-control structure (the disturbance-control coil) is provided and the case where the disturbance-control structure is not provided. Further, with any of the surface current detection coiled conductor and the disturbance-control coiled conductor, calculation is made upon the verification on the assumption that all the coils have one turn of 10 mm×10 mm in size. It is assumed that the measurement target current is at a position of 0 mm, and the disturbance current at respective positions of 30 mm, and −30 mm, in FIG. 3. Calculation is made on the assumption that all the current values are at 1 A, and frequency is 10 MHz.

In FIG. 3, it is difficult to identify the position of a current without use of the disturbance-control structure because of the influence of the disturbance current. With the use of the disturbance-control structure, a peak clearly appears at respective positions of 0 mm, −30 mm, and 30 mm, and it is therefore evident that the target current at the position of 0 mm can be detected while controlling the influence of the disturbance current.

Next, a control structure against a magnetic field approaching the surface current probe from afar is described hereinafter.

Figure 5:
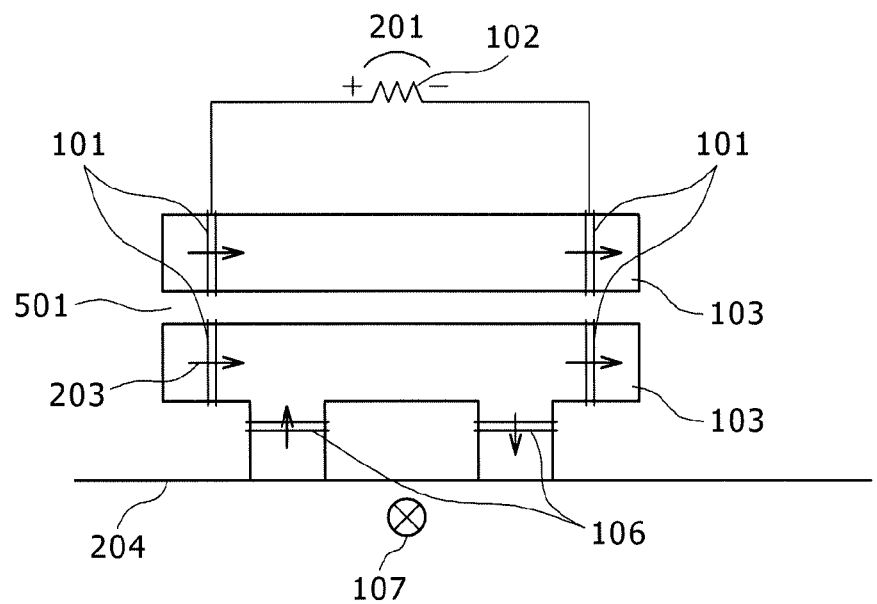
FIG. 5 is a view showing a structure of an afar and disturbance-control probe of the surface current probe according to the invention.

FIG. 5 is a view showing a structure of an afar and disturbance-control probe of the surface current probe according to the invention. The disturbance magnetic fields approaching from afar are uniform in magnetic field strength, and there is the need for causing a summation of induced voltages generated at the time of the disturbance magnetic fields interlinking with the respective coils to become zero. First, the surface current detection coiled conductors 106 each have sensitivity against the magnetic field vertical to the measurement target plane, but since these two coils 106 are opposed in polarity to each other, the induced voltages generated by the uniform magnetic fields cancel each other out. Because the two units of the disturbance-control coiled conductors 101 each have sensitivity in the same polarity against the magnetic field in parallel with the measurement target plane, the coils having the same sensitivity, coupled so as to have respective sensitivities opposed in polarity to each other, need be disposed as shown in FIG. 5. All the coils are coupled in series to each other. Thereby, the control effects can be imparted to the uniform magnetic fields approaching from afar as well. Herein, the afar and disturbance-control coils as disposed are interlinked with the magnetic field generated by the surface current as the measurement target, as well, and the sensitivity polarity of the surface current detection coils is in the reverse direction of that of the afar and disturbance-control coils, however, a distance from the surface current 107 as the measurement target to the afar and disturbance-control coil is extremely large as compared with a distance up to the surface current detection coil 106, so that the influence thereof is small enough so as to be negligible.

Then, the effect of using the magnetic body is described hereinafter. If the magnetic body is used as the core of each coil, that is, the core members 103, this will raise the density of magnetic fluxes interlinking with the respective coils, thereby causing induced voltage generated to be greater. In the case of using the magnetic body for each of the core members 103, the magnetic body used in neighborhood disturbance-control coils¥ is rendered integral with the magnetic body used in the surface current detection coil. Thereby, with the respective magnetic fields generated by the neighborhood disturbance current and the measurement target current, a magnetic path formed of the magnetic body is not divided, so that sensitivity of target-current detection and an effect of neighborhood disturbance control can be improved. Further, this core member need not be rendered integral with the core member of the afar disturbance-control coil, and an air gap 501 may be provided therebetween as shown in FIG. 5.

Figure 6:
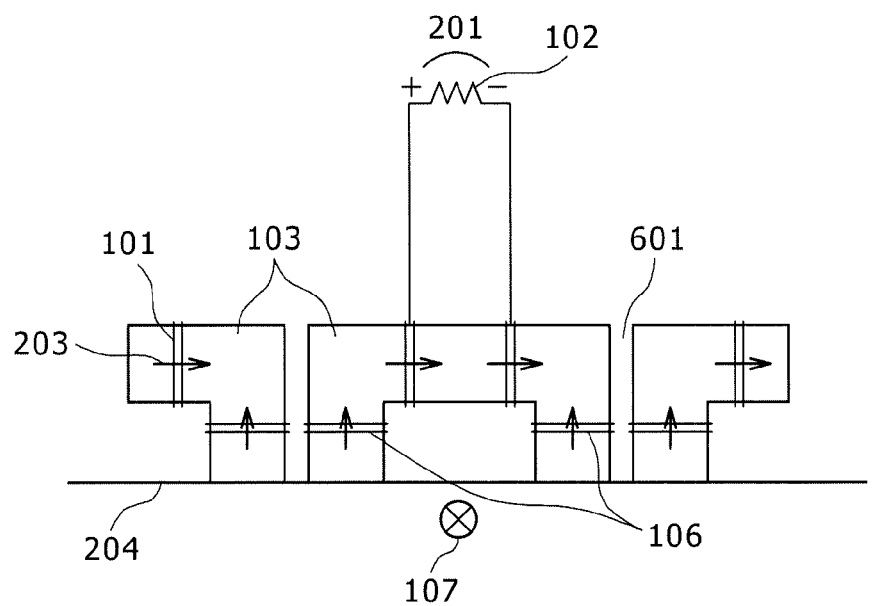
FIG. 6 is a view showing an applied structure of the disturbance-control probe of the surface current probe according to the invention.

FIG. 6 is a view showing an applied structure of the disturbance-control probe of the surface current probe according to the invention. As shown in FIG. 6, for a magnetic body as the core member used in the disturbance-control coil, use is made of a different magnetic body as the core member used in the measurement-target surface current detection coil, and an air gap 601 is provided therebeteween, whereupon an interlinkage amount of the magnetic field generated by the disturbance current, on the opposite side of the measurement target surface-current, can be reduced, thereby enhancing an effect of disturbance-control, along with the detection accuracy of the measurement-target surface-current.

Figure 7:
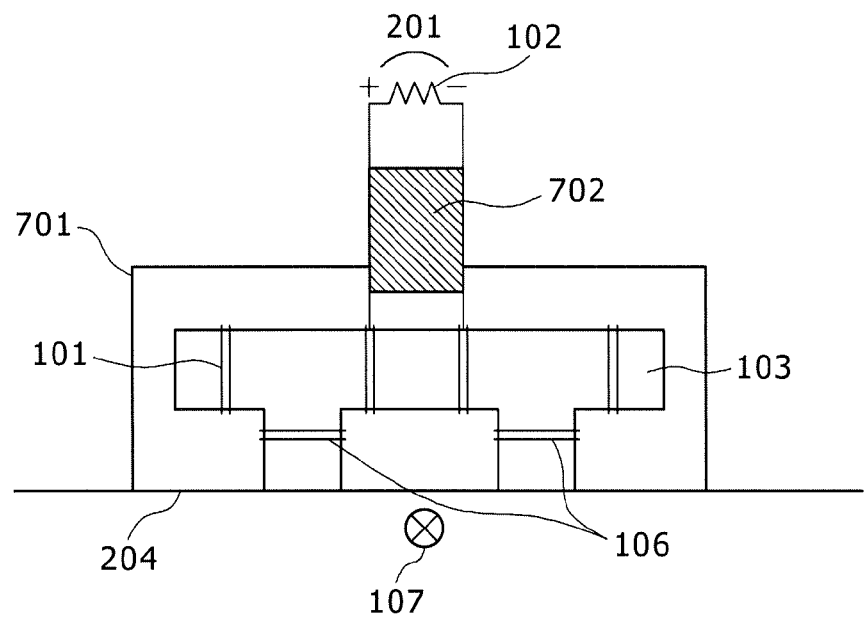
FIG. 7 is a view showing a structure of a surface current probe according to the invention, the surface current probe having a shielded enclosure.

FIG. 7 is a view showing a structure of a surface current probe according to the invention, the surface current probe having a shielded enclosure. If the surface current probe made up of the core member, and the coiled conductors, mounted inside a shielded enclosure 701, as shown in FIG. 7, this will enhance control-effects against the disturbance magnetic field, and the disturbance electric field. Upon mounting, use of a connector 702 can facilitate connection with a cable.

Figure 8:
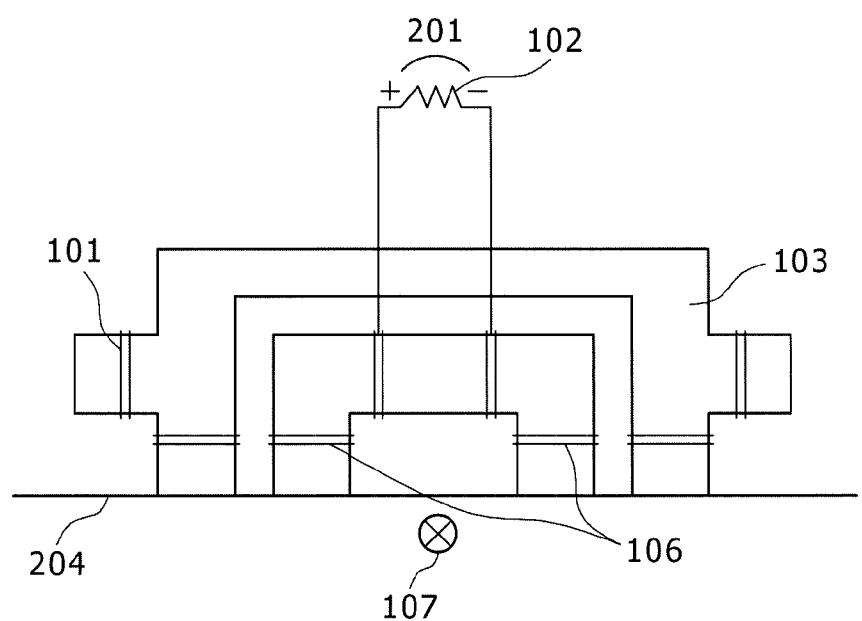
FIG. 8 is a view showing a structure of the surface current probe according to the invention.

FIG. 8 is a view showing a structure of the surface current probe according to the invention. If the magnetic body used as the core member 103 of the disturbance-control coiled conductor 101 is integrated with the surface current detection coil, and the magnetic body thereof in such a way as to cover the latter, this will cause the magnetic field generated by the disturbance current to be concentrated in the magnetic body lower in magnetic resistance, present on the outer side, thereby preventing the magnetic field generated by the disturbance current from entering the surface current detection coil, and the magnetic body thereof. Accordingly, the influence of the disturbance magnetic field can be further reduced.

On the basis of the foregoing description, there are provided a structure capable of removing influences of not only the disturbance magnetic field approaching from afar but also the disturbance magnetic field generated by an current other than an adjacent measurement target current to thereby detect only the magnetic field generated by the surface current as the measurement target, and a surface current probe having the structure.

What is claimed is:

1. A surface current probe comprising:
   two current detection coils disposed so as to detect a magnetic field in a direction vertical to a current detection target plane;
   two disturbance-control coils, each thereof being disposed at a position farther away from each of the two current detection coils, against the current detection target plane, so as to be disposed for detection of a magnetic field in a direction parallel to the current detection target plane; wherein
   one of the disturbance-control coils is coupled to one of the current detection coils in such polarity as to cause the induced voltages to cancel each other out when the disturbance magnetic field generated by the disturbance current flowing on the outer side of the one of the current detection coils is interlinked with both the one of the disturbance-control coils and the one of the current detection coils; and
   a terminal resistor coupled to each of the two disturbance-control coils, wherein the two disturbance-control coils are disposed such that induced voltages generated against the current detection target plane at the time of detection of a magnetic field on the outer side of the two current detection coils are opposed in polarity to each other.

2. The surface current probe according to claim 1, wherein the two disturbance-control coils are opposed in winding order (direction) to each other.

3. The surface current probe according to claim 1, wherein the two surface current detection coils are disposed such that the induced voltages generated against the current detection target plane at the time of detection of a magnetic field on the inner side of the two current detection coils become identical in polarity.

4. The surface current probe according to claim 1, wherein the two disturbance-control coils each are coupled in series to each of the two current detection coils to be coupled to the terminal resistor.

5. The surface current probe according to claim 1, wherein the two disturbance-control coils each are identical to each of the two current detection coils in respect of the product of an opening space of the coil, and the number of turns in the coil.

6. The surface current probe according to claim 1, wherein the two current detection coils are provided between the two disturbance-control coils against the current detection target plane in such a way as to detect the magnetic field in the direction vertical to the current detection target plane.

7. The surface current probe according to claim 1, wherein a core of each of the two disturbance-control coils as well as each of the two current detection coils is a magnetic body.

8. The surface current probe according to claim 1, wherein the two current detection coils, the two disturbance-control coils, and the terminal resistor are housed in a shielded enclosure.

* * * * *